United States Patent
Kuo et al.

(10) Patent No.: US 9,589,862 B2
(45) Date of Patent: Mar. 7, 2017

(54) INTERCONNECT STRUCTURES AND METHODS OF FORMING SAME

(71) Applicant: Taiwan Semiconductor Manufacturing Company, Ltd., Hsin-Chu (TW)

(72) Inventors: Hsuan-Ting Kuo, Taichung (TW); Tsung-Yuan Yu, Taipei (TW); Hsien-Wei Chen, Hsin-Chu (TW); Wen-Hsiung Lu, Jhonghe (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 244 days.

(21) Appl. No.: 13/914,426

(22) Filed: Jun. 10, 2013

(65) Prior Publication Data
US 2014/0256092 A1 Sep. 11, 2014

Related U.S. Application Data

(60) Provisional application No. 61/776,714, filed on Mar. 11, 2013.

(51) Int. Cl.
*H01L 21/00* (2006.01)
*H01L 23/31* (2006.01)
(Continued)

(52) U.S. Cl.
CPC ........ *H01L 23/3171* (2013.01); *H01L 21/563* (2013.01); *H01L 21/566* (2013.01);
(Continued)

(58) Field of Classification Search
CPC ..................................................... H01L 21/563
(Continued)

(56) References Cited

U.S. PATENT DOCUMENTS 5,072,520 A 12/1991 Nelson
5,317,801 A 6/1994 Tamala et al.
(Continued)

FOREIGN PATENT DOCUMENTS

DE 102005040213 A1 3/2006
DE 112005001949 T5 5/2007
(Continued)

*Primary Examiner* — Telly Green
(74) *Attorney, Agent, or Firm* — Slater Matsil, LLP (57) ABSTRACT

Embodiments of the present disclosure include interconnect structures and methods of forming interconnect structures. An embodiment is a method of forming an interconnect structure, the method including forming a first post-passivation interconnect (PPI) over a first substrate, forming a second PPI over the first substrate, and forming a first conductive connector on the first PPI. The method further includes forming a second conductive connector on the second PPI, and forming a molding compound on top surfaces of the first and second PPIs and surrounding portions of the first and second connectors, a first section of molding compound being laterally between the first and second connectors, the first section of molding compound having a curved top surface.

21 Claims, 4 Drawing Sheets

(51) Int. Cl.
*H01L 21/56* (2006.01)
*H01L 23/00* (2006.01)

(52) U.S. Cl.
CPC .......... *H01L 23/3192* (2013.01); *H01L 24/03* (2013.01); *H01L 24/05* (2013.01); *H01L 24/11* (2013.01); *H01L 24/13* (2013.01); *H01L 24/16* (2013.01); *H01L 24/81* (2013.01); *H01L 2224/036* (2013.01); *H01L 2224/0345* (2013.01); *H01L 2224/0347* (2013.01); *H01L 2224/03452* (2013.01); *H01L 2224/0401* (2013.01); *H01L 2224/05548* (2013.01); *H01L 2224/05568* (2013.01); *H01L 2224/05573* (2013.01); *H01L 2224/05624* (2013.01); *H01L 2224/05639* (2013.01); *H01L 2224/05644* (2013.01); *H01L 2224/05647* (2013.01); *H01L 2224/05684* (2013.01); *H01L 2224/10126* (2013.01); *H01L 2224/119* (2013.01); *H01L 2224/1145* (2013.01); *H01L 2224/1181* (2013.01); *H01L 2224/1191* (2013.01); *H01L 2224/11334* (2013.01); *H01L 2224/11462* (2013.01); *H01L 2224/11849* (2013.01); *H01L 2224/131* (2013.01); *H01L 2224/13022* (2013.01); *H01L 2224/13082* (2013.01); *H01L 2224/13109* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16145* (2013.01); *H01L 2224/16225* (2013.01); *H01L 2224/16227* (2013.01); *H01L 2224/73204* (2013.01); *H01L 2224/81024* (2013.01); *H01L 2224/81191* (2013.01); *H01L 2224/81815* (2013.01); *H01L 2224/83104* (2013.01); *H01L 2224/83855* (2013.01)

(58) Field of Classification Search
USPC .................................................. 438/124, 126
See application file for complete search history.

(56) References Cited

U.S. PATENT DOCUMENTS

| | | | |
|---|---|---|---|
| 5,869,904 | A | 2/1999 | Shoji |
| 6,037,065 | A | 3/2000 | Hajmrle et al. |
| 6,158,644 | A | 12/2000 | Brofman et al. |
| 6,187,615 | B1 | 2/2001 | Kim et al. |
| 6,365,978 | B1 | 4/2002 | Ibnabdeljalil et al. |
| 6,369,451 | B2 | 4/2002 | Lin |
| 6,425,516 | B1 | 7/2002 | Iwatsu et al. |
| 6,586,322 | B1 | 7/2003 | Chiu et al. |
| 6,643,923 | B1 | 11/2003 | Hishinuma et al. |
| 6,664,637 | B2 | 12/2003 | Jimarez et al. |
| 6,933,613 | B2 | 8/2005 | Akashi |
| 6,940,169 | B2 | 9/2005 | Jin et al. |
| 7,187,068 | B2 | 3/2007 | Suh et al. |
| 7,372,151 | B1 | 5/2008 | Fan et al. |
| 7,749,882 | B2 | 7/2010 | Kweon et al. |
| 7,977,783 | B1 | 7/2011 | Park et al. |
| 8,264,089 | B2 | 9/2012 | Alvarado et al. |
| 8,345,435 | B2 | 1/2013 | Hamatani et al. |
| 8,362,612 | B1 | 1/2013 | Paek et al. |
| 8,624,392 | B2 | 1/2014 | Yew et al. |
| 8,735,273 | B2 | 5/2014 | Lu et al. |
| 2001/0050434 | A1 | 12/2001 | Kaneda et al. |
| 2002/0001937 | A1 | 1/2002 | Kikuchi et al. |
| 2002/0031868 | A1 | 3/2002 | Capote et al. |
| 2002/0167077 | A1* | 11/2002 | Vincent ................. H01L 21/563 257/684 |
| 2003/0068847 | A1 | 4/2003 | Watanabe et al. |
| 2003/0096453 | A1 | 5/2003 | Wang et al. |
| 2003/0153172 | A1 | 8/2003 | Yajima et al. |
| 2004/0012930 | A1 | 1/2004 | Grigg |
| 2004/0027788 | A1 | 2/2004 | Chiu et al. |
| 2004/0072387 | A1 | 4/2004 | Hong et al. |
| 2004/0266162 | A1 | 12/2004 | Feng |
| 2005/0080956 | A1 | 4/2005 | Zaudtke et al. |
| 2006/0038291 | A1 | 2/2006 | Chung et al. |
| 2006/0063378 | A1 | 3/2006 | Lin et al. |
| 2006/0189114 | A1 | 8/2006 | Seto et al. |
| 2007/0045840 | A1 | 3/2007 | Varnau |
| 2007/0102815 | A1 | 5/2007 | Kaufmann et al. |
| 2007/0108573 | A1 | 5/2007 | Chung et al. |
| 2007/0176290 | A1 | 8/2007 | Park et al. |
| 2007/0184577 | A1 | 8/2007 | Chung et al. |
| 2007/0187825 | A1 | 8/2007 | Hashimoto |
| 2007/0267745 | A1 | 11/2007 | Chao et al. |
| 2008/0001290 | A1 | 1/2008 | Chou et al. |
| 2008/0150134 | A1 | 6/2008 | Shinkai et al. |
| 2008/0308935 | A1 | 12/2008 | Kim et al. |
| 2009/0020864 | A1* | 1/2009 | Pu ........................ H01L 21/561 257/687 |
| 2009/0045513 | A1* | 2/2009 | Kim ..................... H01L 21/568 257/738 |
| 2009/0052218 | A1 | 2/2009 | Kang |
| 2009/0120215 | A1* | 5/2009 | Jacobson ................. F17D 5/00 73/865.8 |
| 2009/0130840 | A1 | 5/2009 | Wang et al. |
| 2009/0140442 | A1 | 6/2009 | Lin |
| 2009/0140942 | A1 | 6/2009 | Mikkola et al. |
| 2009/0146317 | A1 | 6/2009 | Shih |
| 2009/0206479 | A1 | 8/2009 | Daubenspeck et al. |
| 2009/0314519 | A1 | 12/2009 | Soto et al. |
| 2010/0065966 | A1 | 3/2010 | Pendse et al. |
| 2010/0078772 | A1 | 4/2010 | Robinson |
| 2010/0096754 | A1 | 4/2010 | Lee et al. |
| 2010/0140760 | A1 | 6/2010 | Tam et al. |
| 2011/0037158 | A1 | 2/2011 | Youn et al. |
| 2011/0080713 | A1 | 4/2011 | Sunohara |
| 2011/0101520 | A1 | 5/2011 | Liu et al. |
| 2011/0108983 | A1 | 5/2011 | Lu et al. |
| 2011/0278739 | A1 | 11/2011 | Lai et al. |
| 2012/0006592 | A1 | 1/2012 | Ouchi et al. |
| 2012/0199959 | A1 | 8/2012 | Hart et al. |
| 2012/0199991 | A1 | 8/2012 | Okamoto et al. |
| 2012/0261817 | A1 | 10/2012 | Do et al. |
| 2013/0009307 | A1 | 1/2013 | Lu et al. |
| 2013/0105971 | A1 | 5/2013 | Daubenspeck et al. |
| 2013/0147031 | A1 | 6/2013 | Chen et al. |
| 2013/0168850 | A1 | 7/2013 | Samoilov et al. |
| 2013/0181338 | A1 | 7/2013 | Lu et al. |
| 2014/0054764 | A1 | 2/2014 | Lu et al. |
| 2014/0077361 | A1 | 3/2014 | Lin et al. |
| 2014/0159223 | A1 | 6/2014 | Chen et al. |
| 2014/0187103 | A1 | 7/2014 | Chen et al. |
| 2014/0232017 | A1 | 8/2014 | Rampley et al. |
| 2015/0123269 | A1 | 5/2015 | Chen et al. |
| 2015/0137352 | A1 | 5/2015 | Chen et al. |
| 2015/0235977 | A1 | 8/2015 | Shao et al. |
| 2015/0243613 | A1 | 8/2015 | Chen et al. |
| 2015/0262948 | A1 | 9/2015 | Lu et al. |

FOREIGN PATENT DOCUMENTS

| | | | |
|---|---|---|---|
| KR | 1020070076846 | | 7/2007 |
| KR | 20090018442 A | | 2/2009 |
| KR | 20090120215 | * | 11/2009 |
| KR | 20090120215 A | * | 11/2009 |
| KR | 20090120215 A | | 11/2009 |
| KR | 20100131180 A | | 12/2010 |
| TW | 201246540 A | | 11/2012 |

* cited by examiner

INTERCONNECT STRUCTURES AND METHODS OF FORMING SAME

REFERENCE TO RELATED APPLICATIONS

This application relates to the following co-pending and commonly assigned patent applications: Ser. No. 13/349,405, filed Jan. 12, 2012, entitled "Package on Package Interconnect Structure;" Ser. No. 13/751,289, filed Jan. 28, 2013, entitled "System and Method for an Improved Fine Pitch Joint;" Ser. No. 13/838,748, filed Mar. 15, 2013, entitled "Interconnect Structures and Methods of Forming Same;" Ser. No. 13/868,554, filed Apr. 23, 2013, entitled "Apparatus and Method for Wafer Separation;" Ser. No. 13/913,599, filed Jun. 10, 2013, entitled "Interconnect Joint Protective Layer Apparatus and Method;" Ser. No. 13/934,562, filed Jul. 3, 2013, entitled "Packaging Devices, Methods of Manufacture Thereof, and Packaging Methods" and Ser. No. 13/939,966, filed Jul. 11, 2013, entitled "Apparatus and Method for Package Reinforcement."

This application claims the benefit of U.S. Provisional Application No. 61/776,714, filed Mar. 11, 2013, and entitled "Interconnect Structures and Methods of Forming Same," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Solder ball grid arrays are also a technique sometimes used to join substrate, dies or packages, with an array of solder balls deposited on the bonding pads of a first substrate, and with a second substrate, die or package joined at its own bonding pad sites to the first pad via the solder balls. Solder balls may be formed on a pad as liquid solder, and then solidified for additional processing. The environment with the solder balls is subsequently heated to melt the solder balls and the packages compressed to cause the solder balls to contact the upper and lower pads.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely making and using interconnects useful in, for example, wafer level chip scale package (WLCSP) assemblies. Other embodiments may also be applied, however, to other semiconductor devices, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

Figure 9:
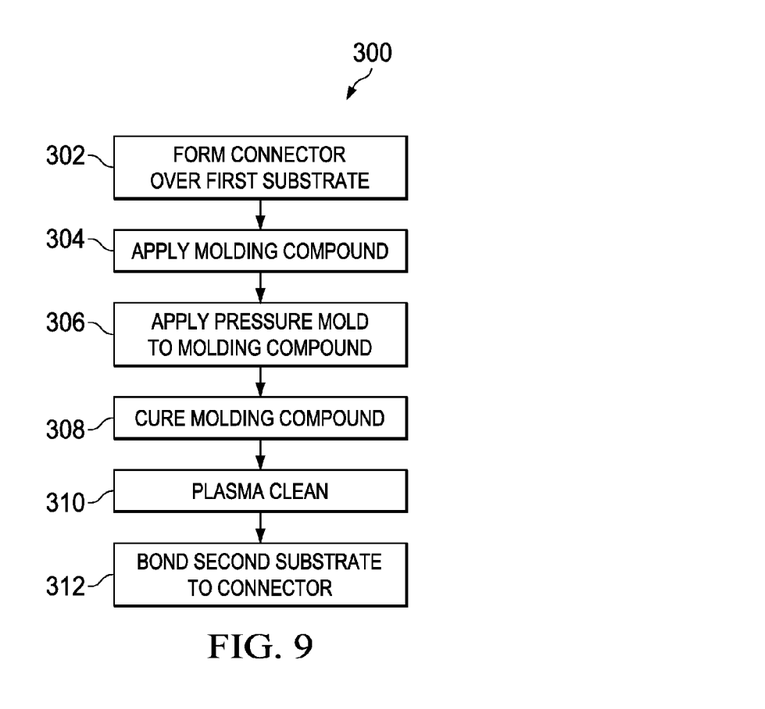
FIG. 9 illustrates a process flow of the process illustrated in FIGS. 1 through 7 in accordance with an embodiment.

FIGS. 1 through 7 are cross-sectional views of intermediate stages in the manufacturing of an interconnect structure in accordance with an embodiment, and FIG. 9 is a process flow of the process shown in FIGS. 1 through 7.

Figure 1:
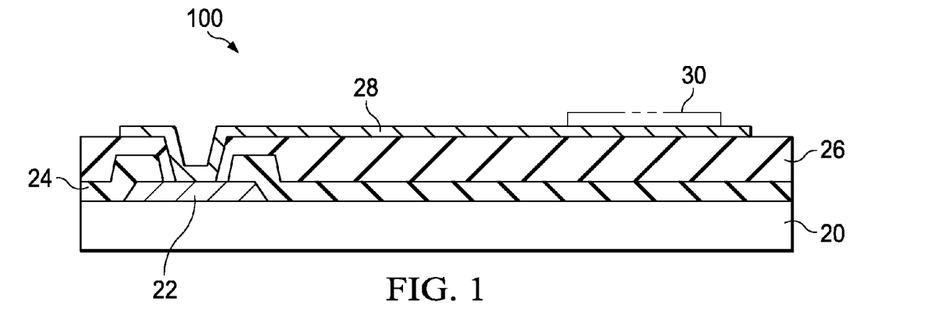
FIGS. 1, 2, 3, 4, 5, 6, and 7 illustrate cross-sectional views of intermediate stages in the manufacturing of an interconnect structure in accordance with an embodiment.

FIG. 1 illustrates an interconnect structure 100 in an intermediate stage of manufacture. The interconnect structure 100 may include a substrate 20, a contact pad 22, a first passivation layer 24, a second passivation layer 26, a post-passivation interconnect (PPI) 28, and an optional flux 30. Substrate 20 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 20 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof.

The substrate 20 may include active and passive devices (not shown in FIG. 1). As one of ordinary skill in the art will recognize, a wide variety of devices such as transistors, capacitors, resistors, combinations of these, and the like may be used to generate the structural and functional requirements of the design for the interconnect structure 100. The devices may be formed using any suitable methods. Only a portion of the substrate 20 is illustrated in the figures, as this is sufficient to fully describe the illustrative embodiments.

The substrate 20 may also include metallization layers (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) and may be formed through any suitable process (such as deposition, damascene, dual damascene, or the like).

The contact pad 22 may be formed over and in electrical contact with the metallization layers in order to help provide external connections to the active and passive devices. The contact pad 22 may be made of aluminum, an aluminum alloy, copper, a copper alloy, nickel, the like, or a combination thereof. The contact pad 22 may be formed using a deposition process, such as sputtering, to form a layer of material (not shown). Portions of the layer of material may then be removed through a suitable process, such as photolithographic masking and etching, to form the contact pad 22. However, any other suitable process may be utilized to form contact pad 22. The contact pad 22 may be formed to have a thickness of between about 0.5 µm and about 4 µm.

A first passivation layer 24 may be formed on the substrate 20 and over the contact pad 22. The first passivation layer 24 may be made of one or more suitable dielectric materials such as silicon oxide, silicon nitride, a polymer such as polyimide, solder resist, polybenzoxazole (PBO), benzocyclobutene (BCB), molding compound, the like, or a combination thereof. The first passivation layer 24 may be formed by various processes such as a spin-on process, chemical vapor deposition (CVD), although any suitable process may be utilized. The first passivation layer 24 may have a thickness from about 0.5 µm and about 30 µm. In some embodiments, a top surface of contact pad 22 and a portion of a bottom surface of the first passivation layer 24 are substantially level.

After the first passivation layer 24 has been formed, an opening may be formed through the first passivation layer 24 to expose at least a portion of the underlying contact pad 22. This opening through the first passivation layer 24 to expose the portion of the underlying contact pad 22 allows for physical and electrical contact between the contact pad 22 and the PPI 28 (discussed further below). The opening through the first passivation layer 24 may be formed using a suitable photolithographic mask and etching process, although any other suitable process to expose portions of the contact pad 22 may alternatively be used.

The second passivation layer 26 may be formed over the contact pad 22 and the first passivation layer 24. The second passivation layer 26 may be formed of similar materials and by similar processes as the first passivation layer 24 described above and the description will not be repeated herein, although the first passivation layer 24 and the second passivation layer 26 need not be the same. The second passivation layer 26 may be formed to have a thickness from about 2 µm and about 30 µm.

After the second passivation layer 26 has been formed, another opening through the second passivation layer 26 to expose at least a portion of the underlying contact pad 22 may be made. The opening through the second passivation layer 26 to the underlying contact pad 22 allows for physical and electrical contact between the contact pad 22 and the PPI 28 (discussed further below). The opening through the second passivation layer 26 may be formed using a suitable photolithographic mask and etching process, although any suitable process to expose portions of the contact pad 22 may be used.

After the opening through the second passivation layer 26 has been formed, the PPI 28 may be formed to extend through the second passivation layer 26 and to extend along the second passivation layer 26. The PPI 28 may provide electrical connection between the contact pad 22 and the subsequently formed connector 32 (see FIG. 2). In some embodiments, the PPI 28 includes a thin seed or barrier layer (not shown) conformally deposited on the second passivation layer 26 and in the opening, such as by physical vapor deposition (PVD), CVD, atomic layer deposition (ALD), the like, or a combination thereof. The seed or barrier layer may be made of a nitride or an oxynitride, such as titanium nitride, titanium oxynitride, tantalum nitride, tantalum oxynitride, tungsten nitride, silicon dioxide, the like, or a combination thereof. The conductive material of the PPI 28 may be deposited over the thin seed or barrier layer and in the opening. The conductive material may be formed by an electro-chemical plating process, CVD, ALD, PVD, the like, or a combination thereof. In an embodiment, the conductive material of the PPI 28 is made of copper, tungsten, aluminum, silver, gold, the like, or a combination thereof. The conductive material may then be patterned to form the PPI 28. In other embodiments, the PPI 28 is formed by first forming and patterning a photo resist (not shown), and then forming the PPI 28 in the patterned photo resist. In these embodiments, after the PPI 28 is formed, the photo resist (not shown) is removed.

After the PPI 28 has been formed, an optional flux 30 may be formed to the PPI 28. The flux 30 may be formed on the PPI 28 to control the spread of the subsequently formed connector 32 (see FIG. 2) on the PPI 28. The flux 30 tends to cause the connector 32 to remain within the region where the flux 30 was applied. In an embodiment, the flux 30 is formed on the PPI 28 as a paste and may be printed on the PPI 28.

Figure 2:
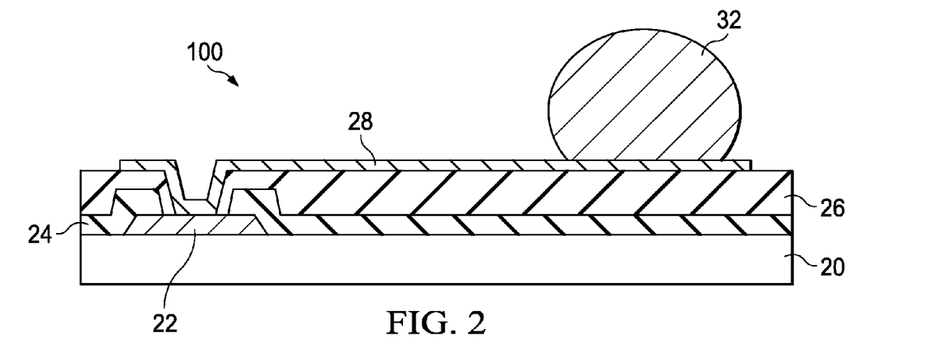

FIG. 2 illustrates the formation of connector 32 (step 302) on the PPI 28. The connector 32 may be a solder ball, a micro bump, a metal pillar, a controlled collapse chip connection (C4) bump, an electroless nickel-electroless palladium-immersion gold technique (ENEPIG) formed bump, or the like. The connector 32 may be made of a conductive material such as solder, copper, aluminum, gold, nickel, silver, palladium, tin, the like, or a combination thereof. In an embodiment in which the connector 32 is a solder bump, the connector 32 is formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shape. In another embodiment, the connector 32 is a metal pillar (such as a copper pillar) formed by a sputtering, printing, electro plating, electroless plating, CVD, or the like. The metal pillar may be solder free and have substantially vertical sidewalls. In some embodiments, a metal cap layer (not shown) is formed on the top of the metal pillar connector 32. The metal cap layer may include nickel, tin, tin-lead, gold, silver, palladium, indium, nickel-palladium-gold, nickel-gold, the like, or a combination thereof and may be formed by a plating process.

Figure 3:
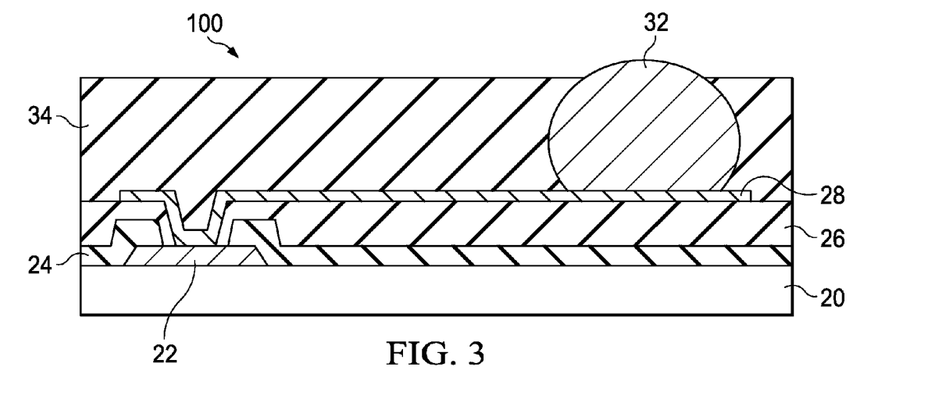

FIG. 3 illustrates the formation of a molding compound 34 (step 304) over the PPI 28 and the second passivation layer 26 and adjoining the connector 32. The molding compound 34 may provide lateral support to the connector 32 during reflow. In an embodiment, the molding compound 34 is a nonconductive material, such as an epoxy, a resin, polyimide, polybenzoxazole (PBO), benzocyclobutene (BCB), a silicone, an acrylate, the like, or a combination thereof. In some embodiments, the molding compound 34 is dispensed in a liquid form with a viscosity from about 50 centipoise (cP) to about 300 cP. The molding compound 34 may be formed to have a top surface over, substantially level with, or below an apex of the connector 32.

Figure 4:
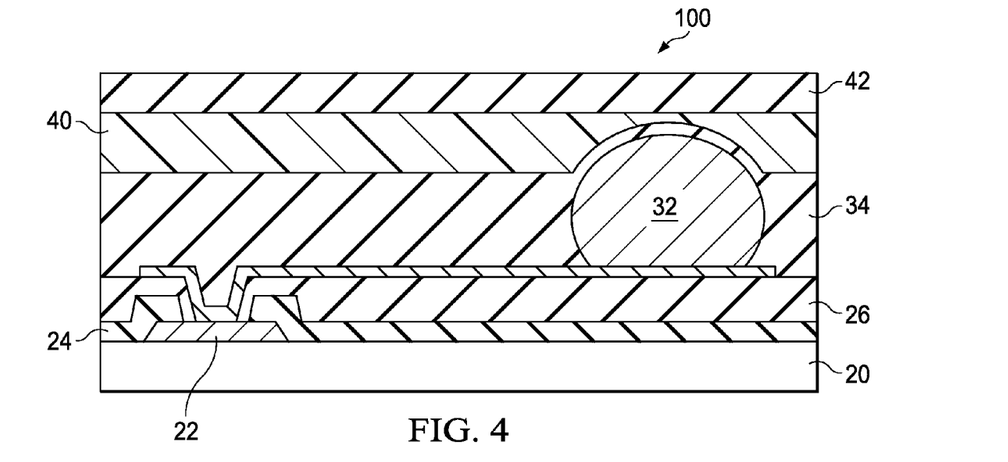

FIG. 4 illustrates applying a molding layer 42 to the molding compound 34 (step 306). The molding layer 42 may shape or mold the molding compound 34. In an embodiment, a release compound 40 is applied to the molding layer 42 to prevent the molding compound 34 from adhering to the molding layer 42. The release compound 40 may be made of ethylene tetrafluoroethylene (ETFE), polytetrafluoroethylene (PTFE), the like, or a combination thereof. In an embodiment, the molding layer 42 is substantially flat and may force the molding compound 34 toward edges of the substrate 20. The molding layer 42 may be applied from about 3 minutes to about 10 minutes and may apply a pressure from about 250 kilonewtons (kN) to about 350 kN to the molding compound 34. The molding compound 34 may be shaped by the molding layer 42 using a layer of release compound 40 thick enough to compress the molding compound 34 while still separating the molding layer 42 from the connector 32. The molding process may cause more of the connector 32 to extend above the top surface of the molding compound 34 (see FIGS. 3 and 5). In an embodiment, the molding layer 42 is used to pressure mold the molding compound 34 to force the molding compound into openings and recesses, and may avoid air pockets or the like in the molding compound 34. In some embodiments, the molding layer 42 is flexible before the molding process and cures to become rigid during the molding process. In these embodiments, the molding layer 42 may contour to the connector 32 similar to the contouring of the release compound 40 illustrated in FIG. 4.

Figure 5:
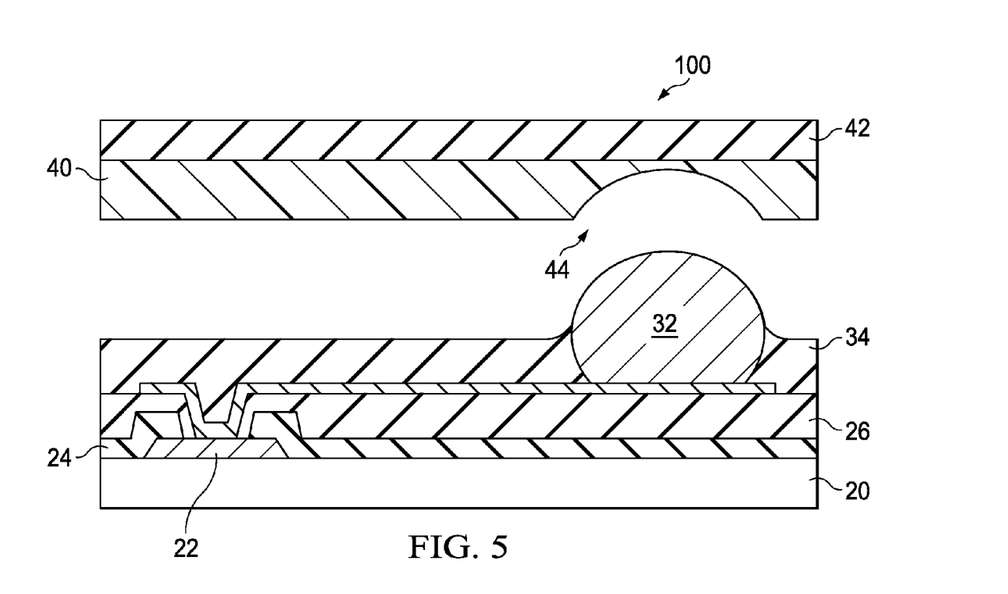

After the application of the molding layer 42 and the release compound 40, the molding compound 34 may be cured (step 308) and the molding layer 42 and the release compound 40 may be removed as illustrated in FIG. 5. As illustrated, the molding process forms causes the release compound 40 to be shaped by the connector 32 forming an indentation 44 in the release compound 40. In some embodiments, the molding compound 34 is applied while substantially liquid, and then may be cured through a chemical reaction, such as in an epoxy or resin. The molding compound 34 may have a curing time from about 3 minutes to about 10 minutes at a temperature from about 130° C. to about 160° C. In an embodiment, the molding compound 34 is fully cured when the molding layer 42 and the release compound 40 are removed. In another embodiment, the molding compound 34 is partially cured when the molding layer 42 and release compound 40 are removed and may finish curing after they are removed. In some other embodiments the molding compound 34 is an ultraviolet (UV) cured polymer applied as a gel or malleable solid capable of being disposed on the PPI 28 and second passivation layer 26 and around or conforming to the connector 32 surface.

Figure 6:
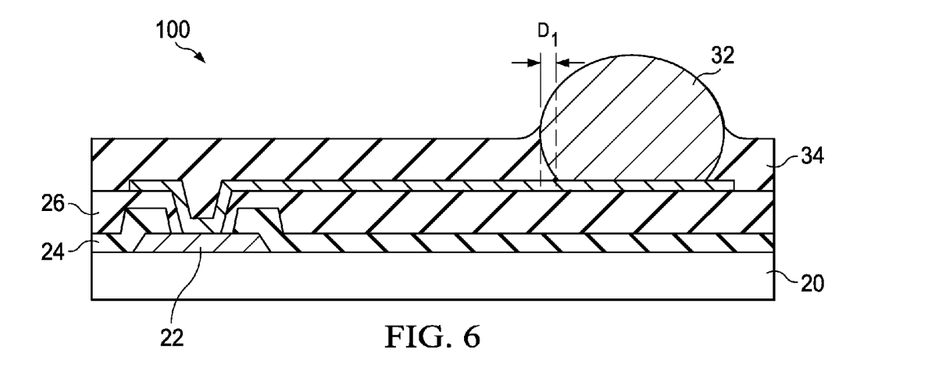

As illustrated in FIG. 6, the molding compound 34 may be molded over a lower portion of the connector 32 so that a portion of the molding compound 34 reaches at least about half of the height of the connector 32. In an embodiment, the molding compound 34 has a final molded height from about 25% to about 75% of the height of the connector 32. In one specific embodiment, the molding compound 34 has a final molded height from about 60 µm to about 400 µm. An upper portion of the connector 32 may be exposed through the molding compound 34. The height of the molding compound 34 may be controlled, for example, by the molding process pressure, the thickness of the release compound 40, the molding process duration, and the viscosity of the molding compound 34. The molding compound 34 is contoured to the body of the solidified connector 32 during application, molding, and curing of the molding compound 34. A top surface of the molding compound near the connector 32 may have a concave shape due to the meniscus effect of the liquid during and after the application and curing processes of the molding compound 34.

The molding compound 34 may be formed to support the connector 32 in later processing steps, such as reflowing the connector 32 for attaching a second substrate (see FIG. 7). In such an example, the molding compound 34 may confine the connector 32 and prevent bridging between adjacent connectors (see FIG. 8A) during the reflow process. In an embodiment, the molding compound 34 extends under an outermost edge of the connector 32 a distance $D_1$ from about 10 µm to about 100 µm.

After the molding layer 42 and the release compound 40 are removed, a plasma cleaning process may be performed (step 310) on the connector 32. The plasma cleaning process may be used to clean the surface of the connector 32 and to remove any residual release compound 40 or molding compound 34. In an embodiment, the plasma cleaning process includes a plasma source and one or more cleaning gases. The plasma source may be an inductively coupled plasma (ICP) etch, a transformer coupled plasma (TCP) etch, an electron cyclotron resonance (ECR) etch, a reactive ion etch (RIE), or the like. Various cleaning gases may be used in the plasma cleaning process. In some embodiments, the plasma cleaning process is performed with gases $N_2$, $O_2$, Ar, the like, or a combination thereof. The plasma cleaning process may be performed with a power in a range from about 400 watts to about 700 watts. The plasma cleaning process may include an etching bias in a range from about 100 volts to about 250 volts.

Figure 7:
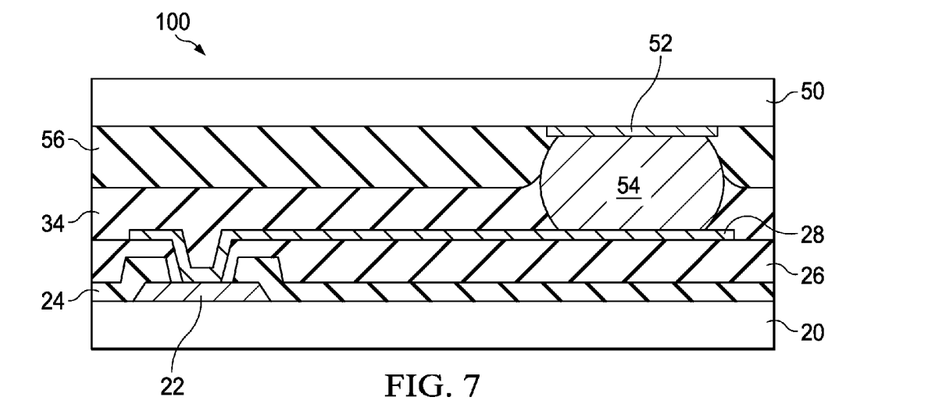

FIG. 7 illustrates bonding a second substrate 50 to the connector 32 (step 312). The second substrate 50 may be similar to the substrate 20 as described above, although the substrate 20 and the second substrate 50 need not be the same. The second substrate 50 may be a carrier, a package substrate, an interposer, or a printed circuit board (PCB) based on an insulating core such as a fiberglass reinforced resin core. One example core material is fiberglass resin such as FR4. Alternatives for the core material include bismaleimide-triazine (BT) resin, or alternatively, other PCB materials or films. Build up films such as Ajinomoto build-up film (ABF) or other laminates may be used for second substrate 50.

The second substrate 50 may include active and passive devices (not shown in FIG. 7). As one of ordinary skill in the art will recognize, a wide variety of devices such as transistors, capacitors, resistors, combinations of these, and the like may be used to generate the structural and functional requirements of the design for the interconnect structure 100. The devices may be formed using any suitable methods.

Only a portion of the second substrate 50 is illustrated in the figures, as this is sufficient to fully describe the illustrative embodiments.

The second substrate 50 may also include metallization layers (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) and may be formed through any suitable process (such as deposition, damascene, dual damascene, or the like).

The second substrate 50 has a bond pad 52 which will be physically and electrically coupled to the connector 32. In some embodiments, a pre-solder layer is formed over the bond pad 52, and in other embodiments, a contact pad or an under bump metallization (UBM) is formed over the bond pad 52. The bond pad 52 may be made of copper, nickel, aluminum, gold, silver, tin, the like, or a combination thereof. In an embodiment, the second substrate 50 is bonded to the first substrate 20 by a reflow process. During this reflow process, the bond pad 52 on the second substrate 50 is in contact with the connector 32 to form a bonding structure 54 to physically and electrically couple the second substrate 50 to the PPI 28.

After the substrate 50 is bonded to the substrate 20, an optional underfill material 56 may be formed between the substrate 50 and the molding compound 34 surrounding an upper portion of the bonding structure 54. The underfill material 56 may be injected or otherwise formed in the space between the substrate 50 and the molding compound 34. The underfill material 56 may, for example, be made of a liquid epoxy, deformable gel, silicon rubber, or the like, that is dispensed between the substrate 50 and the molding compound 34, and then cured to harden. This underfill material 56 is used, among other things, to reduce cracking in and to protect the bonding structure 54.

The number of bonding structures 54, the number of bond pads 52, the number of PPIs 28, and the number of contact pads 22 in FIG. 7 are only for illustrative purposes and are not limiting. There could be any suitable number of bonding structures 54, bond pads 52, PPIs 28, and contact pads 22

Figure 8A:
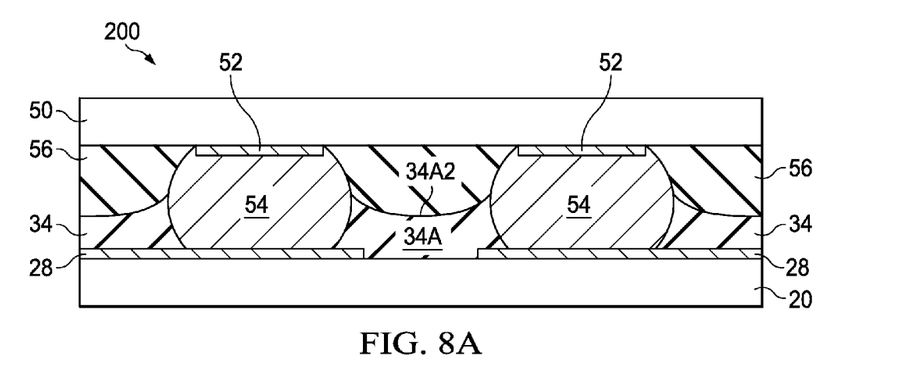
FIG. 8A illustrates a cross-sectional view of an interconnect structure in accordance with another embodiment.

FIG. 8A illustrates a cross-sectional view of an interconnect structure 200 with multiple bonding structures 54, multiple PPIs 28, multiple bond pads 52, and molding compound 34 surrounding the multiple bonding structures 54 in accordance with another embodiment. Details regarding this embodiment that are similar to those for the previously described embodiment will not be repeated herein.

The molding compound 34 may be applied, molded, and cured as described above. The section of molding compound 34A between the adjacent bonding structures 54 has a concave or meniscus top surface 34A2 in part due to the meniscus effect of the liquid molding compound 34 during and after the application and curing processes of the molding compound 34.

Figure 8B:
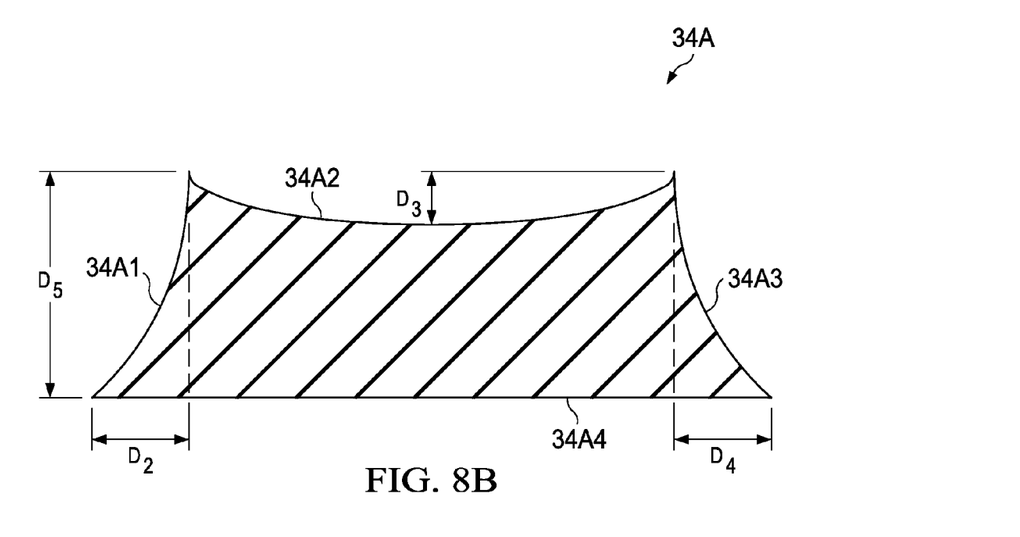
FIG. 8B illustrates a cross-sectional view of a molding compound section from the interconnect structure in FIG. 8A in accordance with an embodiment.

FIG. 8B illustrates an isolated view of the section of molding compound 34A between the bonding structures 54. The section of molding compound 34A has three curved or concave surfaces 34A1, 34A2, and 34A3 and a substantially planar fourth surface 34A4. As described above, the top surface 34A2 is concave in part due to the meniscus effect of the molding compound 34 and in part due to the molding process (described above). The concave top surface and the concave side surfaces may provide additional strength and protection for the bonding structures 54. The top surface 34A2 has a concavity distance $D_3$ from about 10 μm to about 50 μm. The sides 34A1 and 34A3 have concave surfaces due to the shape of the adjoining bonding structures 54 (see FIG. 8A). The sides 34A1 and 34A3 have concavity distances $D_2$ and $D_4$, respectively, from about 10 μm to about 100 μm. The concavity distances $D_2$, $D_3$, and $D_4$ of the molding compound 34 may be controlled, for example, by the molding process pressure, the molding process duration, and the viscosity of the molding compound 34, and the size of the bonding structures 54.

It has been found that the molding compound surrounding the connectors and/or the bonding structures protects their shape and reduces the stress between the connectors/bonding structures and the underlying interconnects. The molding process includes a release compound that contours to the connectors and forces the molding compound into openings and recesses, and helps to avoid air pockets in the molding compound. Further, the molding compound protects the underlying structures such as the PPI, the passivation layers, the contact pad, and the substrate from the stresses of later processing steps. This protection afforded by the molding compound results in improved the reliability of the interconnect structure.

An embodiment is a method of forming an interconnect structure, the method including forming a first post-passivation interconnect (PPI) over a first substrate, forming a second PPI over the first substrate, and forming a first conductive connector on the first PPI. The method further includes forming a second conductive connector on the second PPI, and forming a molding compound on top surfaces of the first and second PPIs and surrounding portions of the first and second connectors, a first section of molding compound being laterally between the first and second connectors, the first section of molding compound having a curved top surface.

Another embodiment is a method of forming an interconnect structure, the method includes forming a contact pad on a top surface of a first substrate, forming a first passivation layer on the top surface of the first substrate, the first passivation layer being on a portion of a top surface of the contact pad, and forming a second passivation layer on the first passivation layer, the second passivation layer being on a portion of the top surface of the contact pad. The method further includes forming a first post-passivation interconnect (PPI) contacting the top surface of the contact pad and extending along the top surface of the second passivation layer, forming a first connector on the first PPI, depositing a molding compound over the second passivation layer, the first PPI, and the first connector, and applying a pressure mold to the molding compound, the molding compound having a concave meniscus top surface after the applying the pressure mold, the concave meniscus top surface has a concavity length from about 10 μm to about 50 μm.

A further embodiment is an interconnect structure including a first post-passivation interconnect (PPI) over a first substrate, a first conductive connector on the first PPI, a second PPI over the first substrate, and a second conductive connector on the second PPI. The interconnect structure further includes a molding compound on top surfaces of the first and second PPIs and surrounding portions of the first and second connectors, a first section of molding compound being laterally between the first and second connectors, the first section of molding compound having a curved top surface.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming an interconnect structure, the method comprising:
    forming a first post-passivation interconnect (PPI) over a first substrate;
    forming a second PPI over the first substrate;
    forming a first conductive connector on the first PPI;
    forming a second conductive connector on the second PPI; and
    dispensing a molding compound in liquid form on top surfaces of the first and second PPIs and surrounding portions of the first and second conductive connectors;
    forming a release compound on a pressure mold;
    applying the pressure mold to bring the release compound in contact with the molding compound to form the molding compound around the first and second conductive connectors;
    while the pressure mold is applied, performing a first curing process to partially cure the molding compound;
    removing the release compound and pressure mold; and
    after removing the release compound and pressure mold, performing a second curing process to finish curing the partially cured molding compound, the cured molding compound having a first section of molding compound being laterally between the first and second conductive connectors, the first section of molding compound having a curved top surface.

2. The method of claim 1, wherein after the applying the pressure mold, an apex of the first section of molding compound is from 25% to about 75% of a height of the first and second conductive connectors.

3. The method of claim 1 further comprising after the forming the molding compound, performing a plasma cleaning process on the first and second conductive connectors.

4. The method of claim 1, wherein the curved top surface is a concave meniscus.

5. The method of claim 4, wherein the concave meniscus top surface has a concavity distance from about 10 μm to about 50 μm, the concavity distance being a depth of the concavity of the concave meniscus top surface.

6. The method of claim 1 further comprising bonding a second substrate to the first and second conductive connectors, the second substrate not contacting any portion of the molding compound.

7. The method of claim 1, wherein the molding compound comprises an epoxy, a polyimide, polybenzoxazole, or a combination thereof.

8. A method of forming an interconnect structure, the method comprising:
    forming a contact pad on a top surface of a first substrate;
    forming a first passivation layer on the top surface of the first substrate, the first passivation layer being on a portion of a top surface of the contact pad;
    forming a second passivation layer on the first passivation layer, the second passivation layer being on a portion of the top surface of the contact pad;
    forming a first post-passivation interconnect (PPI) contacting the top surface of the contact pad and extending along the top surface of the second passivation layer;
    forming a first connector on the first PPI;
    depositing a molding compound over the second passivation layer, the first PPI, and the first connector;
    applying a pressure mold to bring a release compound in contact with the molding compound;
    while the pressure mold is applied, performing a first curing process to partially cure the molding compound;
    removing the release compound and pressure mold; and
    after removing the release compound and pressure mold, performing a second curing process to finish curing the partially cured molding compound, the cured molding compound having a concave meniscus top surface, the concave meniscus top surface has a concavity distance from about 10 μm to about 50 μm, the concavity distance being a depth of the concavity of the concave meniscus top surface.

9. The method of claim 8, wherein the first passivation layer is silicon nitride, the second passivation layer is polyimide, and the first connector is a solder ball.

10. The method of claim 8 further comprising:
    forming a second PPI extending over the first substrate;
    forming a second connector on the second PPI, the second connector laterally adjacent the first connector; and
    after the applying the pressure mold, the molding compound between first connector and the second connector having a concave meniscus top surface.

11. The method of claim 8, wherein the applying a pressure mold to the molding compound further comprises:
    forming a release compound on the molding compound;
    bringing the pressure mold into contact with the release compound; and
    forcing the pressure mold and the release compound in a direction towards the top surface of the first substrate, the release compound conforming to the first connector.

12. The method of claim 11, wherein the forcing the pressure mold and release compound further comprises applying from 250 kilonewtons to 350 kilonewtons of force to the pressure mold.

13. The method of claim 11, wherein during the forcing the pressure mold and the release compound, the pressure mold conforms to the first connector.

14. The method of claim 8 further comprising bonding a second substrate to the first connector, the second substrate not contacting any portion of the molding compound.

15. The method of claim 1 further comprising:
    forming a first contact pad on a top surface of the first substrate, the first PPI contacting the top surface of the first contact pad; and
    forming a second contact pad on a top surface of the first substrate, the second PPI contacting the top surface of the second contact pad.

16. A method comprising:
    forming a contact pad over a first substrate;
    forming a first passivation layer over the first substrate, the first passivation layer contacting a portion of a top surface of the contact pad;

forming a first post-passivation interconnect (PPI) contacting the top surface of the contact pad and extending along the top surface of the first passivation layer;

forming a first connector on the first PPI;

depositing a molding compound over the first passivation layer, the first PPI, and the first connector; and forming a release compound on the molding compound;

bringing a pressure mold into contact with the release compound;

forcing the pressure mold and the release compound in a direction towards the top surface of the first substrate, the release compound conforming to and contacting the first connector;

while the release compound is contacting the first connector, performing a first curing process to partially cure the molding compound;

removing the pressure mold and the release compound, the partially cured molding compound having a concave meniscus top surface after the removing the pressure mold and the release compound; and after removing the pressure mold and the release compound, performing a second curing process to finish curing the partially cured molding compound.

17. The method of claim 16, wherein the forcing the pressure mold and release compound further comprises applying from 250 kilonewtons to 350 kilonewtons of force to the pressure mold.

18. The method of claim 16, wherein during the forcing the pressure mold and the release compound, the pressure mold conforms to the first connector.

19. The method of claim 16 further comprising bonding a second substrate to the first connector, the second substrate not contacting any portion of the molding compound.

20. The method of claim 6 further comprising:
injecting an underfill material between the cured molding compound and the second substrate, the underfill material surrounding and contacting portions of the first and second conductive connectors.

21. The method of claim 8, wherein the molding compound is a polymer.

* * * * *